United States Patent
Ko et al.

(10) Patent No.: US 10,312,107 B2
(45) Date of Patent: Jun. 4, 2019

(54) FORMING INTERCONNECT STRUCTURE USING PLASMA TREATED METAL HARD MASK

(75) Inventors: Chung-Chi Ko, Nantou (TW); Chia-Cheng Chou, Keelung (TW); Shing-Chyang Pan, Jhudong Township (TW); Keng-Chu Lin, Ping-Tung (TW); Shwang-Ming Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 933 days.

(21) Appl. No.: 13/228,011

(22) Filed: Sep. 8, 2011

(65) Prior Publication Data

US 2013/0062774 A1    Mar. 14, 2013

(51) Int. Cl.
*H01L 21/311* (2006.01)
*H01L 21/321* (2006.01)
*H01L 21/768* (2006.01)

(52) U.S. Cl.
CPC ...... *H01L 21/31144* (2013.01); *H01L 21/321* (2013.01); *H01L 21/76811* (2013.01); *H01L 21/76813* (2013.01)

(58) Field of Classification Search
None
See application file for complete search history.

(56) References Cited

U.S. PATENT DOCUMENTS

| | | | |
|---|---|---|---|
| 8,080,475 B2 * | 12/2011 | RamachandraRao et al. | ............... 438/691 |
| 2003/0124842 A1 * | 7/2003 | Hytros et al. | ................. 438/680 |
| 2008/0318435 A1 * | 12/2008 | Mistkawi et al. | ............ 438/745 |

* cited by examiner

*Primary Examiner* — Su C Kim
*Assistant Examiner* — David S Wilbert
(74) *Attorney, Agent, or Firm* — Slater Matsil, LLP

(57) ABSTRACT

A method includes forming a metal hard mask over a low-k dielectric layer. The step of forming the metal hard mask includes depositing a sub-layer of the metal hard mask, and performing a plasma treatment on the sub-layer of the metal hard mask. The metal hard mask is patterned to form an opening. The low-k dielectric layer is etched to form a trench, wherein the step of etching is performed using the metal hard mask as an etching mask.

20 Claims, 9 Drawing Sheets

FORMING INTERCONNECT STRUCTURE USING PLASMA TREATED METAL HARD MASK

BACKGROUND

Integrated circuit devices such as transistors are formed over semiconductor wafers. The devices are interconnected through metal lines and vias to form functional circuits, wherein the metal lines and vias are formed in back-end-of-line processes. To reduce the parasitic capacitance of the metal lines and vias, the metal lines and vias are formed in low-k dielectric layers, which typically have k values lower than 3.8, lower than 3.0, or lower than 2.5.

In the formation of the metal lines and vias, the low-k dielectric material in a low-k dielectric layer is etched to form trenches and via openings. The etching of the low-k dielectric material may involve forming a hard mask and a dielectric hard mask layer over the low-k dielectric material, and using the patterned hard mask as an etching mask to form trenches. Via openings are also formed and self aligned to the trench. The trenches and the via openings are then filled with a metallic material, which may comprise copper. A chemical mechanical polish (CMP) is then performed to remove excess portions of the metallic material over the low-k dielectric material.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of forming metal lines and vias using a metal hard mask scheme is provided in accordance with various embodiments. The intermediate stages of forming the metal lines and vias are illustrated. The variations of the embodiments are discussed. Throughout the various views and illustrative embodiments, like reference numbers are used to designate like elements.

Figure 1:
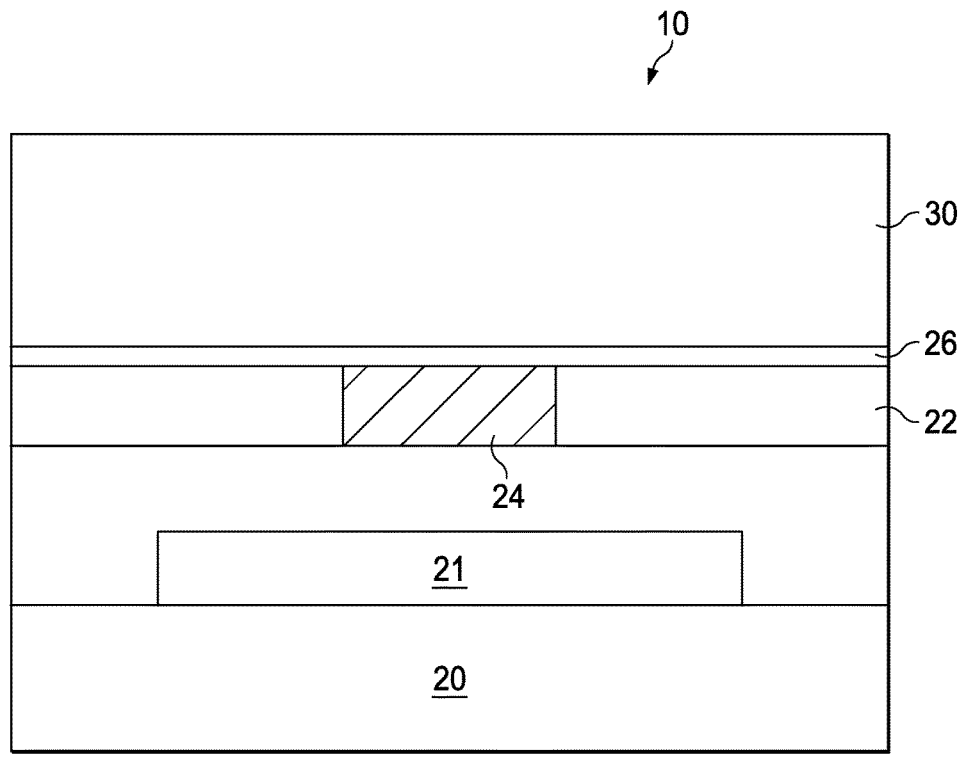
FIGS. 1 through 8 are cross-sectional views of intermediate stages in the manufacturing of a metal line and a via in a low-k dielectric layer in accordance with various embodiments.

Referring to FIG. 1, wafer 10, which includes substrate 20 and overlying layers, is provided. Substrate 20 may be formed of a commonly used semiconductor material such as silicon, silicon germanium, or the like, and may be a bulk substrate or a semiconductor-on-insulator (SOI) substrate. Integrated circuit devices 21 such as transistors are formed at a surface of substrate 20. Dielectric layer 22 is formed over substrate 20. In an embodiment, dielectric layer 22 is a low-k dielectric layer, for example, having a dielectric constant (k value) lower than about 3.0. Metal feature 24 is formed in dielectric layer 22. In some embodiments, metal feature 24 is formed of copper or a copper alloy, although it may also comprise other conductive materials such as tungsten, aluminum, or the like.

Etch stop layer 26 is formed over dielectric layer 22 and metal feature 24. Etch stop layer 26 may be formed of silicon carbide, silicon nitride, or the like. Dielectric layer 30 is further formed over etch stop layer 26. Dielectric layer 30 may be formed of a low-k dielectric material with a dielectric constant (k value) lower than about 3.5, or lower than about 2.5, for example. Accordingly, throughout the description, dielectric layer 30 is alternatively referred to as low-k dielectric layer 30. Low-k dielectric layer 30 may be formed of a porous or a non-porous low-k dielectric material. In an embodiment, low-k dielectric layer 30 has a high modulus, for example, greater than about 8 MPa. The modulus of low-k dielectric layer 30 may also be between about 8 MPa and about 20 MPa. With low-k dielectric layer 30 having a high modulus, the line bending of the resulting metal lines (not shown) formed in low-k dielectric layer 30 may be reduced.

Figure 2A:
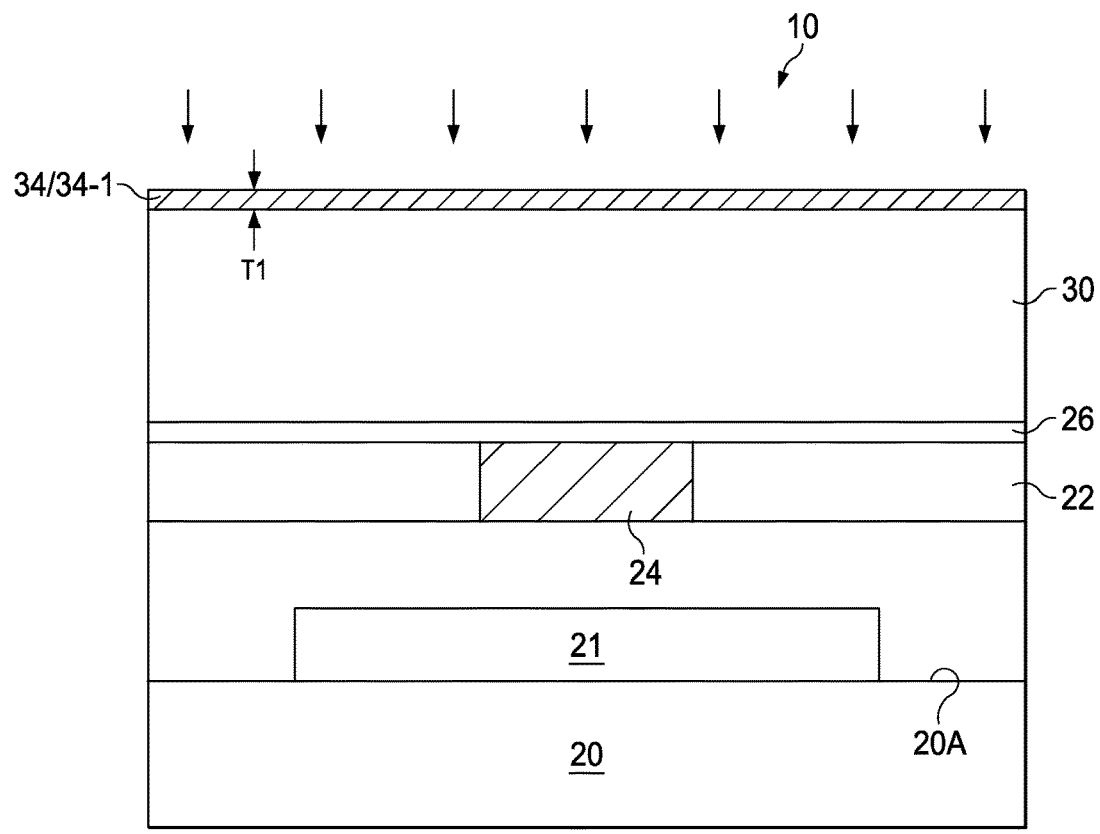

Referring to FIGS. 2A through 2D, metal hard mask 34 is formed over low-k dielectric layer 30. In an embodiment, metal hard mask 34 comprises titanium nitride. Alternatively, metal hard mask 34 comprises tantalum nitride, titanium, tantalum, boron nitride, and combinations thereof. Metal hard mask 34 may include one or a plurality of sub-layers. FIG. 2A illustrates the deposition and the treatment of sub-layer 34-1. The deposition may be performed using a chemical vapor deposition (CVD) method such as plasma enhanced CVD (PECVD), atomic layer deposition (ALD), or the like. Thickness T1 of sub-layer 34-1 may be between about 5 Å and about 30 Å, although a greater or a smaller thickness may also be used. In an exemplary embodiment, the precursors for the deposition of sub-layer 34-1 may include $TiCl_4$, $N_2$, Ar, $H_2$, and the like. The temperature of wafer 10 during the deposition may be between about 200° C. and about 450° C.

After the deposition of sub-layer 34-1, the treatment (symbolized by arrows) is performed on the exposed sub-layer 34-1. The treatment may be performed using plasma. In an exemplary embodiment, the process gas for the treatment is selected from ammonia ($NH_3$), $N_2$, He, $H_2$, Ar, and combinations thereof, from which the plasma is generated. The power for the treatment may be between about 500 watts and about 2,000 watts. The treatment time may be between about 1 second and about 10 seconds. The temperature of wafer 10 during the treatment may be between about 200° C. and about 450° C. During the treatment, plasma is generated, and sub-layer 34-1 is bombarded and densified. As a result, the resulting sub-layer 34-1 may be substantially free from vertical grains that have longitudinal directions perpendicular to major surface 20A of substrate 20. In scanning electron microscopy (SEM) images, sub-layer 34-1 may appear to be a substantially integral layer, or appear to include horizontal grains that have longitudinal axis substantially parallel to major surface 20A of substrate 20. Throughout the description, the deposition and the treatment of a sub-layer of metal hard mask 34 are in combination referred to as a deposition-treatment cycle.

Figure 2B:
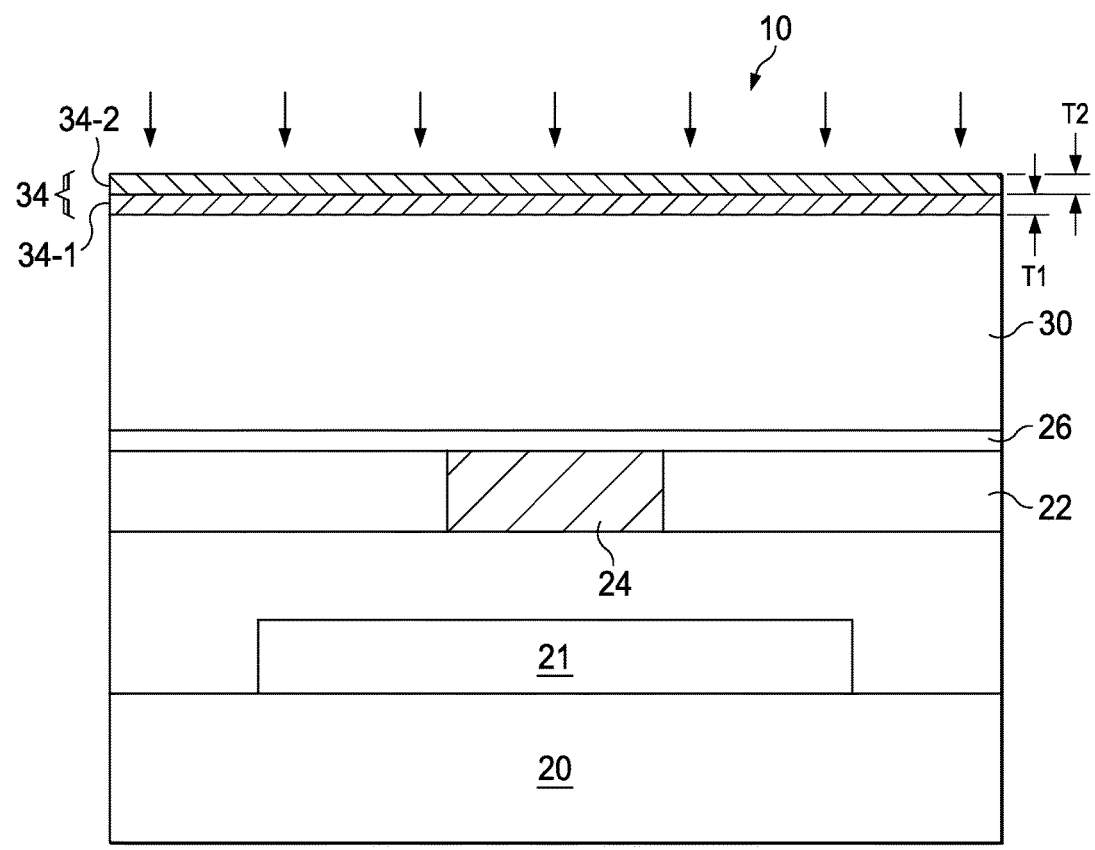

FIG. 2B illustrates a second deposition-treatment cycle for forming sub-layer 34-2 over and in physical contact with sub-layer 34-1. Sub-layer 34-2 may be formed of a same material as that of sub-layer 34-1, although different materials may be used. In an embodiment, thickness T2 of sub-layer 34-2 is similar to thickness T1 of sub-layer 34-1. Alternatively, thickness T2 is different from thickness T1. Also similar to sub-layer 34-1, sub-layer 34-2 may be formed using CVD, ALD, or the like. After the formation of sub-layer 34-2, a treatment (symbolized by arrows) is performed to densify sub-layer 34-2 and to make the grains, if any, of sub-layer 34-2 more horizontal. The process conditions of the treatment may be similar to that of the treatment performed on sub-layer 34-1.

Figure 2C:
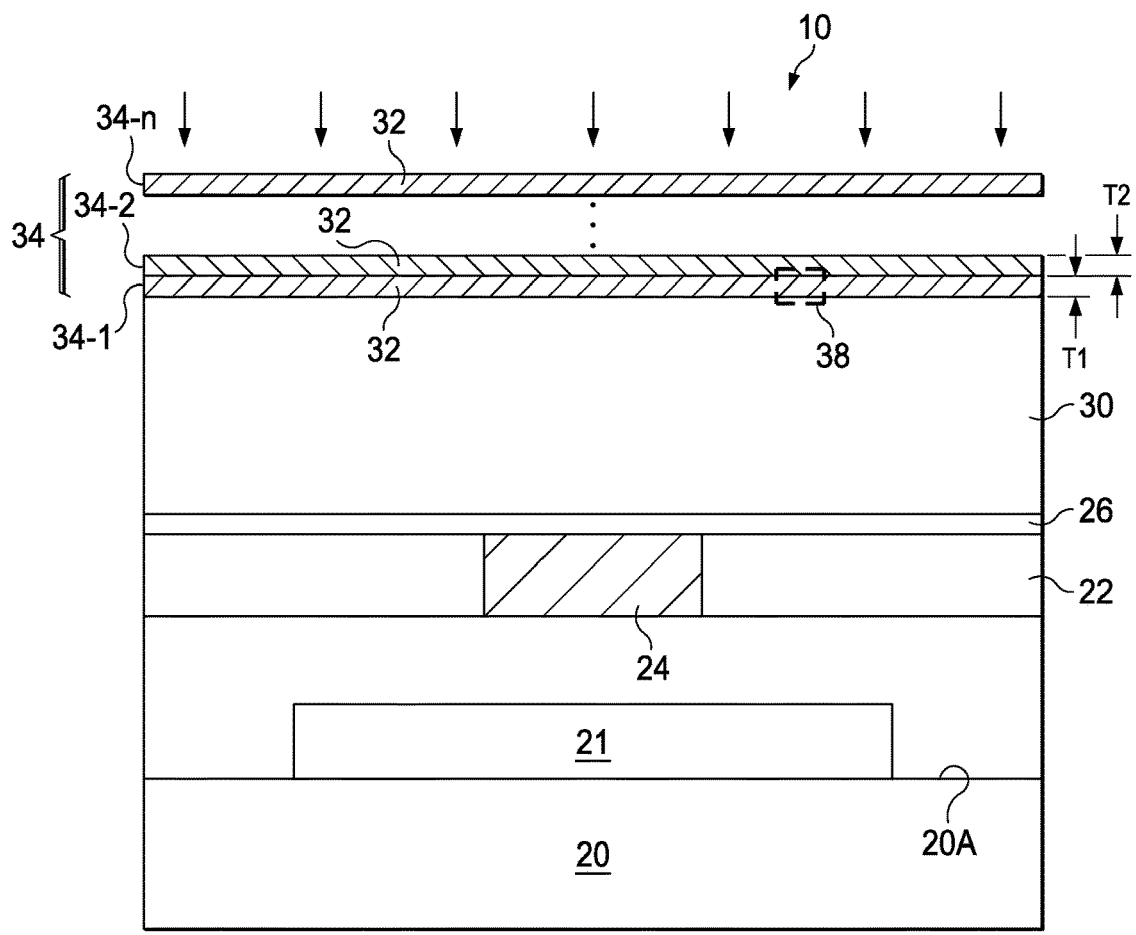

As shown in FIG. 2C, more deposition-treatment cycles may be performed to form additional sub-layers, which include sub-layer 34-3 (not shown) up to sub-layer 34-n, wherein sub-layer n is the top sub-layer. Integer n represents the total count of deposition-treatment cycles for forming metal hard mask 34, wherein the total count n may be equal to or greater than 2, greater than or equal to about 5, or between about 5 and 20, although more deposition-treatment cycles may be performed. Sub-layers 34-1 through 34-n may be distinguishable from each other. For example, in SEM images, sub-layers 34-1 through 34-n may be visible as separate sub-layers. Also, interfaces 32 between neighboring sub-layers 34-1 through 34-n may be clearly visible, for example, in the SEM images. Interfaces 32 are substantially parallel to major surface 20A of substrate 20. Similarly, each of the deposition-treatment cycles may include a deposition step to deposit a sub-layer, and a treatment (symbolized by arrows) to treat the respective sub-layer before the next deposition-treatment cycle is started. The plurality of deposition-treatment cycles may be performed in-situ in a same chamber. The process for each of the deposition-treatment cycles and the materials of the respective materials may refer to the formation of sub-layer 34-1 (FIG. 2A).

Figure 2D:
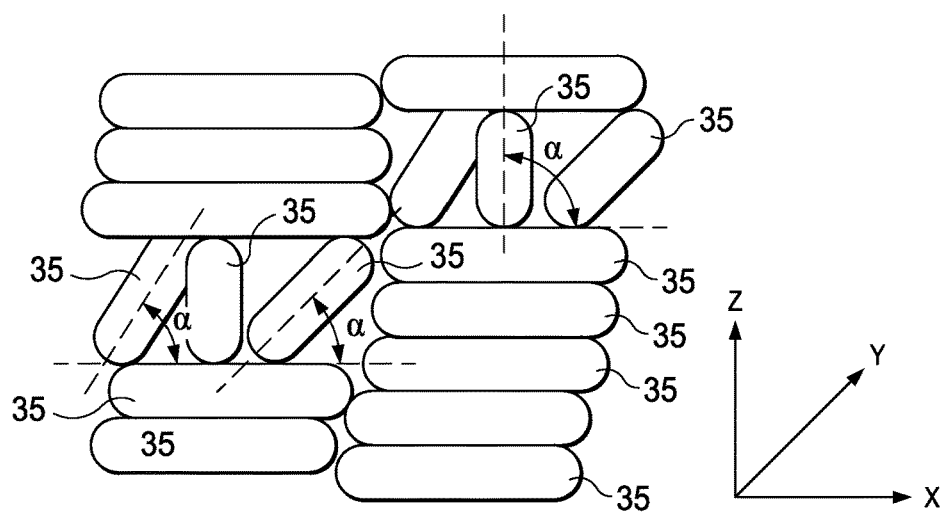

FIG. 2D schematically illustrates a magnified view of a portion of metal hard mask 34, wherein the magnified view schematically illustrates portion 38 of metal hard mask 34 (FIG. 2C). As shown in FIG. 2D, metal hard mask 34 and the respective sub-layers may include grains 35, each having a longitudinal axis, wherein the dimensions of grains 35 in the longitudinal axis are greater than the respective dimensions along other axis. The longitudinal axis may form slant angle α with the major surface 20A (not shown in FIG. 2D, please refer to FIG. 2C) of substrate 20. Throughout the description, grains 35 that have slant angles α greater than 45 degrees are referred to as vertical grains (or columnar grains), while grains 35 that have slant angles α equal to or smaller than 45 degrees are referred to as horizontal grains. Due to the plasma post-treatment and the corresponding effect of the bombardment to metal hard mask 34, the number of horizontal grains 35 may increase. In an embodiment, the percentage of vertical grains 35, which is equal to the ratio of a total count of vertical grains in metal hard mask 34 to the total number of grains in metal hard mask 34, may be less than about 20 percent. In some embodiments, metal hard mask 34 may also be substantially free from vertical grains, wherein the percentage of vertical grains, if any, may be smaller than about 5 percent. Sub-layers 34-1 through 34-n may also be horizontal distinguishable layers that do not have distinguishable grains therein.

The total thickness of metal hard mask 34 may be between about 100 Å and about 400 Å. Metal hard mask 34 may have an inherent compressive stress, for example, between about −0.8 GPa and about −1.2 GPa. During the deposition of sub-layers 34-1 through 34-n, process conditions may be adjusted to reduce the compressive stress in metal hard mask 34. As a result, the line bending (buckling) of the low-k dielectric lines may be reduced, wherein the low-k dielectric lines are portions of low-k dielectric between neighboring trenches (for example, refer to trench 50 in FIGS. 6A and 6B).

Figure 3:
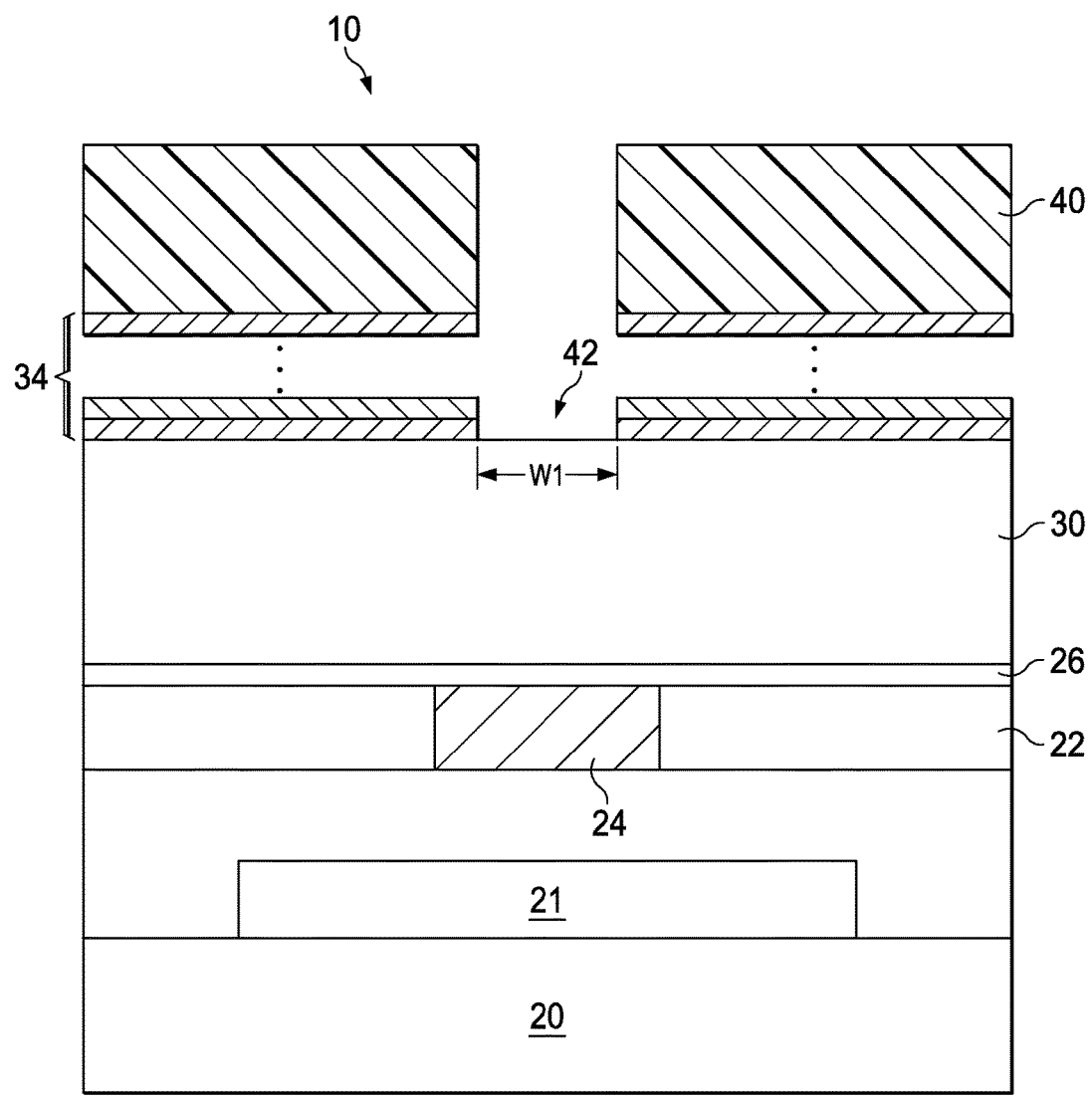
Figure 4:
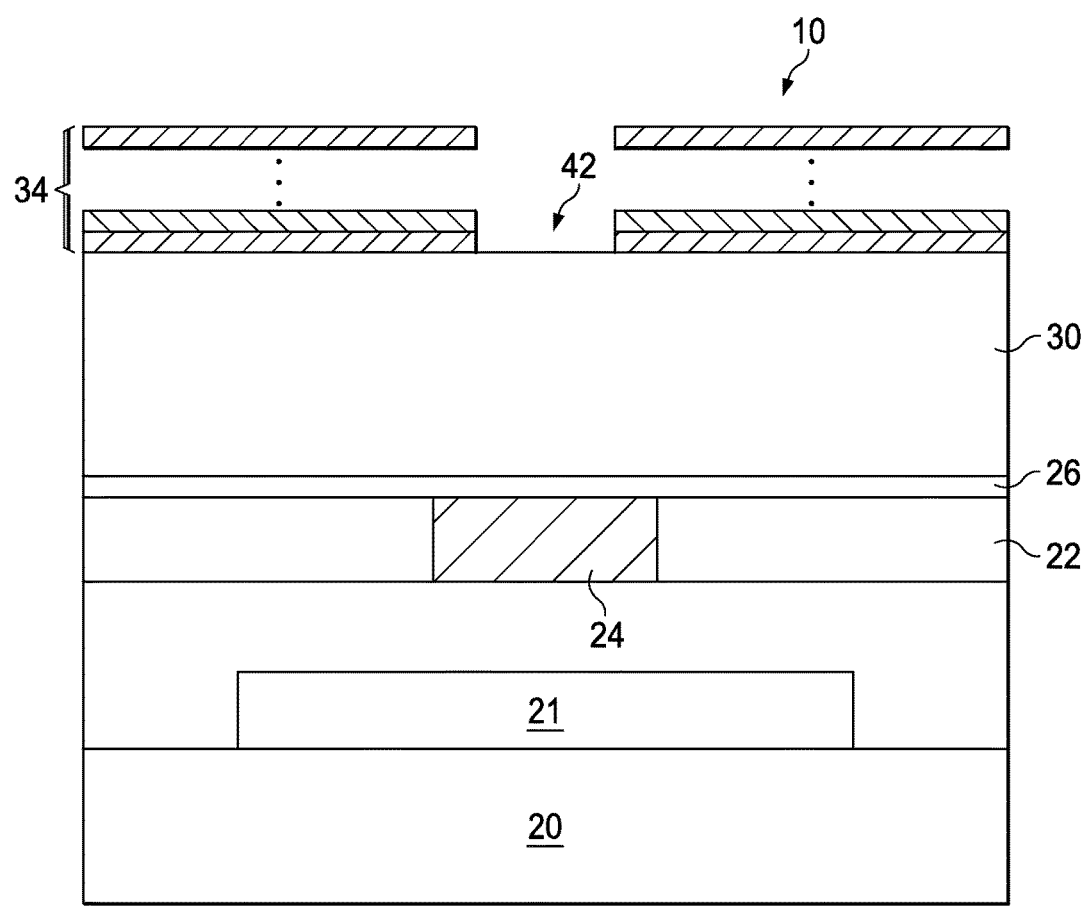

Referring to FIG. 3, photo resist 40 is formed and patterned. The patterned photo resist 40 is then used as an etching mask to etch metal hard mask 34, and the etching may stop on or over the top surface of low-k dielectric layer 30. Opening 42 is thus formed in metal hard mask 34. In a top view (not shown) of the structure shown in FIG. 3, opening 42 may have a strip shape with length L1 (not shown in FIG. 3, please refer to FIG. 6B) greater or equal than width W1 (FIG. 3). Next, as shown in FIG. 4, photo resist 40 is removed, for example, in an ashing step.

Figure 5:
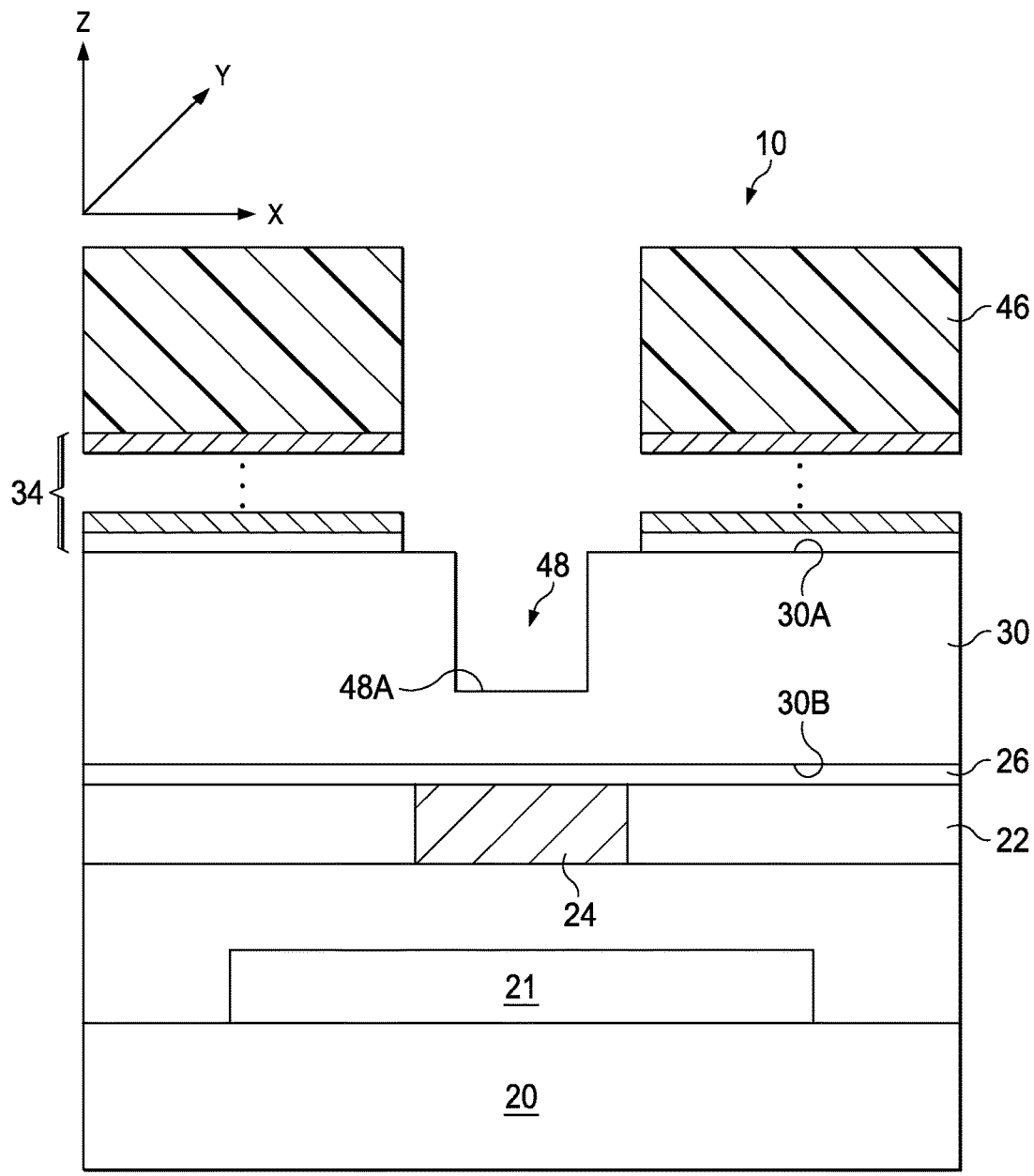

Referring to FIG. 5, photo resist 46 is applied and patterned, and via opening 48 is formed by etching into low-k dielectric layer 30. Bottom surface 48A of via opening 48 is at an intermediate level between top surface 30A and bottom surface 30B of low-k dielectric layer 30. The etching is self aligned in the X direction since metal hard mask 34 limits the size and the position of via opening 48 in the X direction, wherein the X direction is parallel to the illustrated plane. In the Y direction that is perpendicular to the illustrated plane, photo resist 46 defines the size and the position of via opening 48. To maintain the self-alignment, the portions of metal hard mask 34 that are exposed through the opening in photo resist 46 cannot be etched-through. With the horizontal-layered structure, metal hard mask 34 has a higher resistance to resist the etching, and hence is less likely to be etched-through than the metal hard masks having column structures having vertical grains.

Figure 6A:
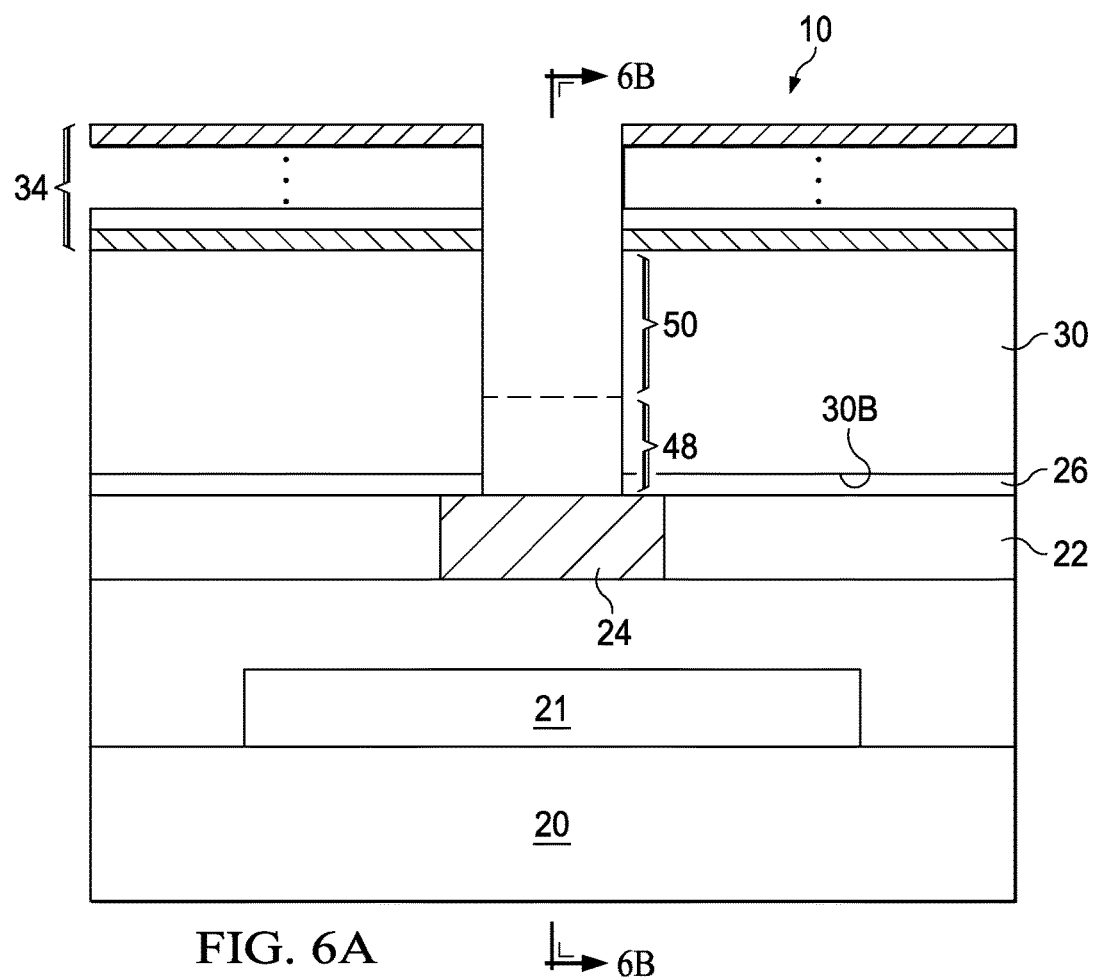
Figure 6B:
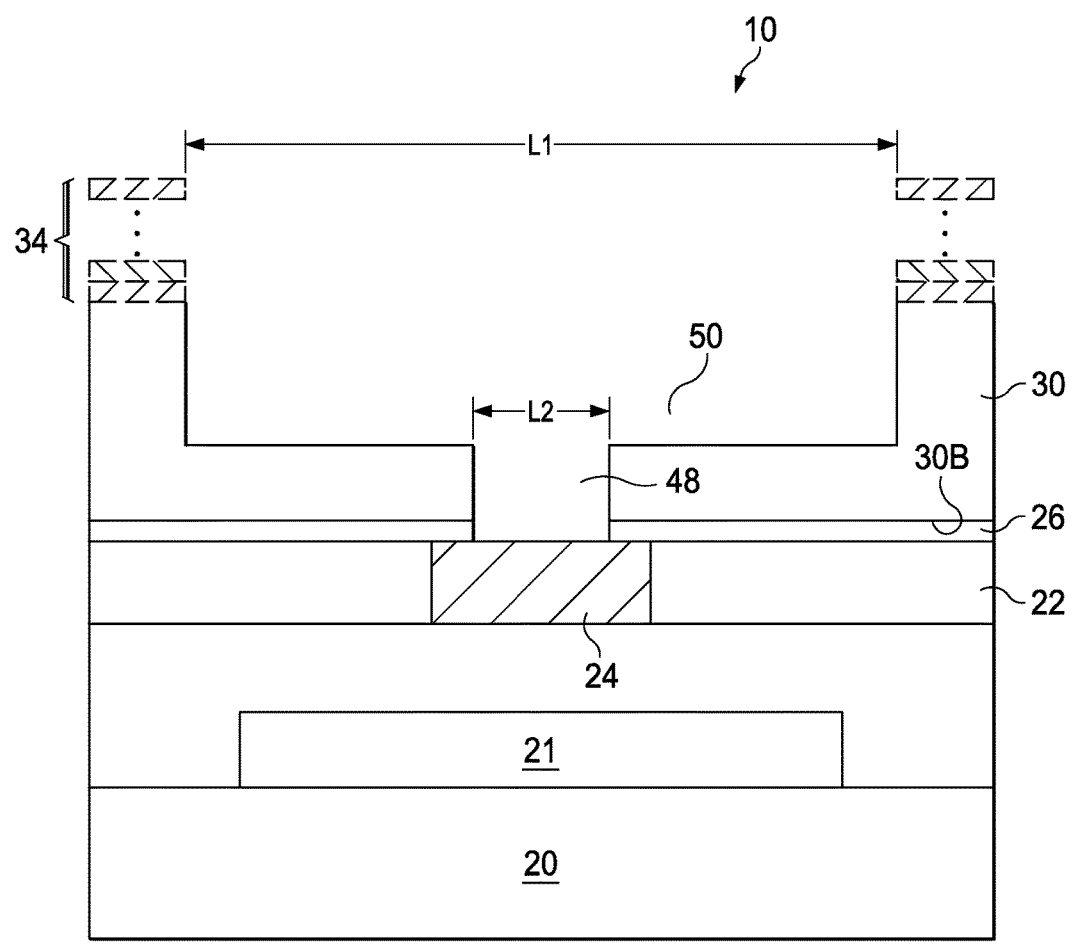

FIGS. 6A and 6B illustrate the removal of photo resist 46, the formation of trench 50, and the downward extension of via opening 48. First, photo resist 46 is removed, and metal hard mask 34 may be exposed. Next, an etching is performed to etch low-k dielectric layer 30, so that trench 50 is formed. The etching may be an anisotropic etching. During the etching, metal hard mask 34 is used as the etching mask so that the pattern of trench 50 is similar to the pattern of opening 42 (FIG. 3) of metal hard mask 34. Trench 50 is also substantially vertically aligned to opening 42. At the same time trench 50 is formed, via opening 48 extends downwardly until via opening 48 extends to bottom surface 30B of low-k dielectric layer 30. Etch stop layer 26 is also etched, until metal feature 24 is exposed.

FIG. 6B illustrates a cross-sectional view of the structure shown in FIG. 6A, wherein the cross-sectional view is taken along a plane crossing line 6B-6B in FIG. 6A. In FIG. 6B, metal hard mask 34 and the respective sub-layers are illustrated using dashed lines since they are not in the illustrated plane. Trench 50 has length L1, which is greater than or equal length L2 of via opening 48.

Figure 7:
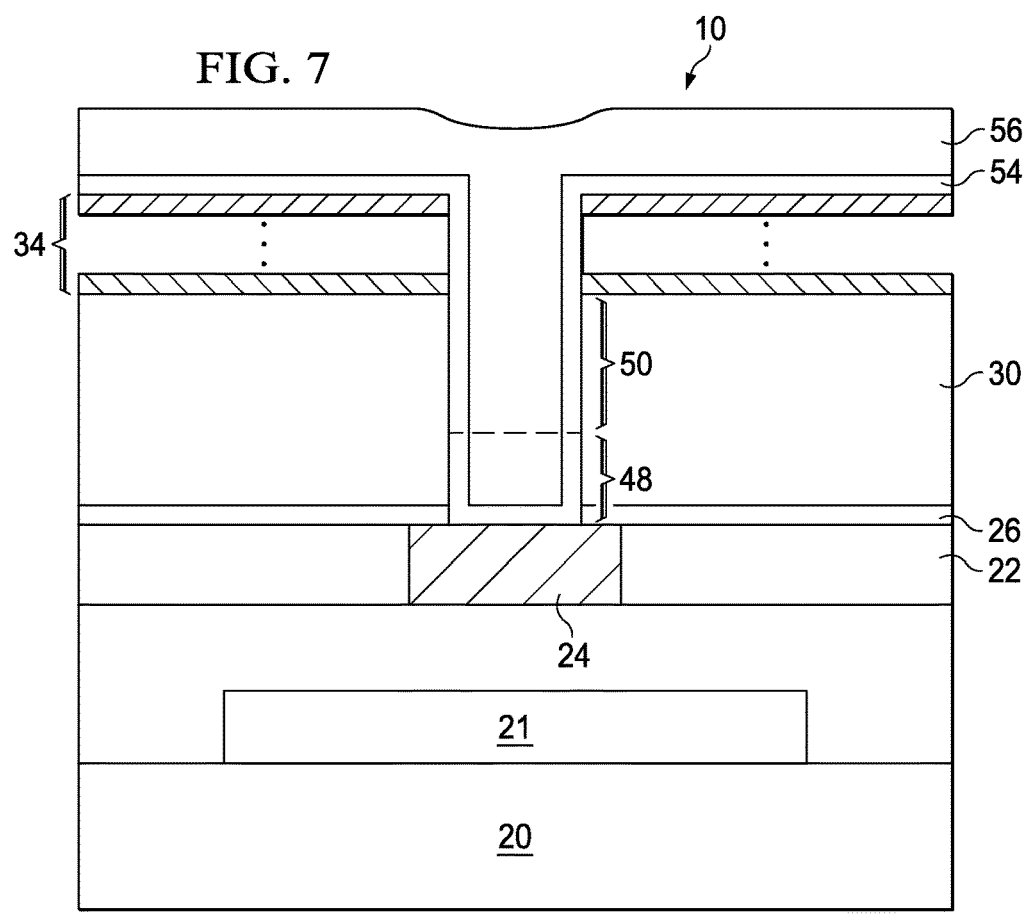

Referring to FIG. 7, diffusion barrier layer 54 and metallic material 56 are filled into trench 50 and via opening 48. Diffusion barrier layer 54 may be formed of titanium, titanium nitride, tantalum, tantalum nitride, or combinations thereof. Metallic material 56 may be formed of substantially pure copper, pure copper, or copper alloys. Metallic material 56 may be filled to a level higher than the top surface of metal hard mask 34.

Figure 8:
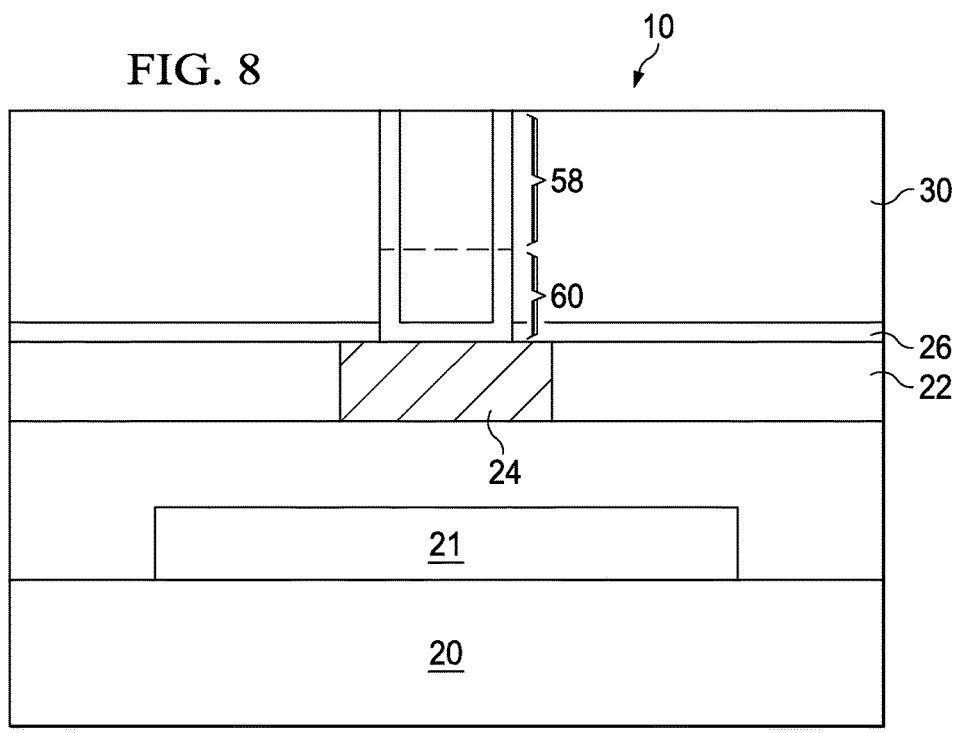

Next, as shown in FIG. 8, a planarization such as a chemical mechanical polish (CMP) is performed, and the excess portions of metallic material 56 and diffusion barrier layer 54 are removed. Metal hard mask 34 may also be removed in the CMP. In the resulting structure, the portions of diffusion barrier layer 54 and metallic material 56 remaining in trench 50 and via opening 48 form metal lines 58 and via 60, respectively. Metal lines 58 and via 60 are electrically coupled to metal feature 24.

In the embodiments, by forming metal hard mask 34 through a plurality of deposition-treatment cycles comprising depositions and post-treatments, metal hard mask 34 have horizontal sub-layers that are densified. Accordingly, metal hard mask 34 has greater resistance to the etching. This results in an increase in the formation window of metal hard mask 34. The formation of metal hard mask 34 may be tuned to have a smaller compressive stress without causing metal hard mask 34 to be undesirably etched in the self-aligned formation of via openings. With a smaller compressive stress, the low-k dielectric lines in neighboring trenches suffer less from buckling, and the resulting metal lines filled in the trenches suffer less from line bending.

In accordance with embodiments, a method includes forming a metal hard mask over a low-k dielectric layer. The step of forming the metal hard mask includes depositing a sub-layer of the metal hard mask, and performing a plasma treatment on the sub-layer of the metal hard mask. The metal hard mask is patterned to form an opening. The low-k dielectric layer is etched to form a trench, wherein the step of etching is performed using the metal hard mask as an etching mask.

In accordance with other embodiments, a method includes forming a low-k dielectric layer over a semiconductor substrate, and forming a metal hard mask over the low-k dielectric layer, wherein the metal hard mask includes a plurality of sub-layers distinguishable from each other. The metal hard mask is patterned to form an opening in the metal hard mask. The low-k dielectric layer is etched to form a via opening in the low-k dielectric layer. The low-k dielectric layer is etched to form a trench using the metal hard mask as an etching mask. A metal line and a via are formed in the trench and the via opening, respectively.

In accordance with yet other embodiments, a device includes a semiconductor substrate, a low-k dielectric layer over the semiconductor substrate, and a metal hard mask over the low-k dielectric layer. The metal hard mask includes a plurality of sub-layers distinguished from each other. Interfaces between the plurality of sub-layers are substantially parallel to a top surface of the semiconductor substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a metal hard mask over a low-k dielectric layer, wherein the step of forming the metal hard mask comprises:
        depositing a first layer of the metal hard mask comprising horizontal grains and vertical grains;
        performing a plasma treatment on the first layer of the metal hard mask, wherein the first layer of the metal hard mask has a first thickness, and wherein after the plasma treatment, the metal hard mask is substantially free from vertical grains;
        depositing a second layer of the metal hard mask, wherein the second layer of the metal hard mask has a second thickness different from the first thickness of the first layer of the metal hard mask; and
        performing a plasma treatment on the second layer of the metal hard mask;
    patterning the metal hard mask to form an opening;
    etching the low-k dielectric layer to form a trench, wherein the step of etching is performed using the metal hard mask as an etching mask;
    forming a diffusion barrier layer in the trench;
    filling a metallic material into the trench, wherein the metallic material is over the diffusion barrier layer, and the diffusion barrier layer and the metallic material comprise portions overlapping the metal hard mask; and
    performing a chemical mechanical polish (CMP) to remove excess portions of the metallic material over the metal hard mask.

2. The method of claim 1, wherein the step of forming the metal hard mask further comprises a plurality of deposition-treatment cycles, and wherein each of the deposition-treatment cycles comprises:
    depositing a first additional layer of the metal hard mask;
    performing a plasma treatment on the first additional layer of the metal hard mask; depositing a second additional layer of the metal hard mask; and
    performing a plasma treatment on the second additional layer of the metal hard mask.

3. The method of claim 2, wherein the additional layer and the layer are formed of a same material.

4. The method of claim 1, wherein the low-k dielectric layer is over a substrate having a major surface, wherein the horizontal grains have slant angles smaller than 45 degrees with the major surface, and the vertical grains have slant angles greater than 45 degrees with the major surface.

5. The method of claim 1, wherein the CMP is performed until the metal hard mask is fully removed.

6. The method of claim 1, wherein the plasma treatment lasts between about 1 second and about 10 seconds, and wherein during the plasma treatment, a wafer comprising the metal hard mask and the low-k dielectric layer is at a temperature between about 200° C. and about 450° C.

7. The method of claim 1, wherein the metal hard mask comprises a material selected from the group consisting essentially of boron nitride.

8. The method of claim 1 further comprising:
    forming a via opening in the low-k dielectric layer, wherein the via opening is underlying the trench, and wherein a location and a size of the via opening is limited by the metal hard mask during the step of forming the via opening, wherein the diffusion barrier layer and the metallic material are also filled into the via opening.

9. A method comprising:
    forming a low-k dielectric layer over a semiconductor substrate;
    forming a metal hard mask over the low-k dielectric layer, wherein the metal hard mask comprises a plurality of sub-layers distinguishable from each other, with the plurality of sub-layers comprising boron nitride, wherein the forming the metal hard mask is performed at least in part with an atomic layer deposition, wherein a first sub-layer of the plurality of sub-layers of the metal hard mask is formed directly over the low-k dielectric layer prior to forming the remainder of the plurality of sub-layers of the metal hard mask, wherein the first sub-layer of the plurality of sub-layers of the metal hard mask has a first thickness, and wherein at least one of the plurality of sub-layers of the metal hard mask has a second thickness different from the first thickness of the first sub-layer of the plurality of sub-layers of the metal hard mask;

patterning the metal hard mask to form an opening in the metal hard mask;

etching the low-k dielectric layer to form a trench using the metal hard mask as an etching mask;

etching the low-k dielectric layer to form a via opening in the low-k dielectric layer; and forming a metal line and a via in the trench and the via opening, respectively, wherein the forming the metal line and the via comprises:
  filling a conductive material into the trench and the openings; and
  performing a planarization to remove excess portions of the conductive material and the metal hard mask, with remaining portions of the conductive material forming the metal line and the via.

10. The method of claim 9, wherein the step of forming the metal hard mask comprises a plurality of deposition-treatment cycles, and wherein each of the deposition-treatment cycles comprises:
  depositing one of the plurality of sub-layers of the metal hard mask; and
  bombarding the one of the plurality of sub-layers to convert vertical grains to horizontal grains.

11. The method of claim 10, wherein in the bombarding, substantially all vertical grains in the one of the plurality of sub-layers are converted to horizontal grains.

12. The method of claim 10, wherein the metal hard mask comprises grains, and a percentage of vertical grains to all grains is smaller than about 20 percent.

13. A method comprising:
  forming a metal hard mask over a low-k dielectric layer, wherein the forming the metal hard mask comprises:
    depositing a first sub layer of the metal hard mask comprising horizontal grains and vertical grains, wherein the first sub layer of the metal hard mask has a first thickness;
    modifying directions of longitudinal axis of grains in the first sub layer of the metal hard mask, wherein substantially all vertical grains are converted to horizontal grains;
    depositing a second sub layer of the metal hard mask comprising horizontal grains and vertical grains, wherein the second sub layer of the metal hard mask has a second thickness different from the first thickness of the first sub layer of the metal hard mask; and
    modifying directions of longitudinal axis of grains in the second sub layer of the metal hard mask, wherein substantially all vertical grains are converted to horizontal grains;
  patterning the metal hard mask to form an opening;
  etching the dielectric layer to form a trench, wherein the etching is performed using the metal hard mask as an etching mask;
  filling the trench with a conductive material, wherein the conductive material comprises:
    a first portion in the trench;
    a second portion extending into the metal hard mask; and
    a third portion higher than the metal hard mask; and
  performing a planarization to remove the metal hard mask and the second portion and the third portion of the conductive material.

14. The method of claim 13, wherein the metal hard mask comprises boron nitride.

15. The method of claim 13, wherein the modifying directions comprises bombarding the metal hard mask.

16. The method of claim 13, wherein the modifying directions is performed after the depositing.

17. The method of claim 13 further comprising a plurality of deposition-treatment cycles to increase a thickness of the metal hard mask, wherein each of the deposition-treatment cycles comprises:
  depositing an additional sub layer of the metal hard mask; and
  performing a plasma treatment on the additional sub layer of the metal hard mask.

18. The method of claim 17, wherein the additional sub layers of the plurality of deposition-treatment cycles are formed of a same material.

19. The method of claim 1, wherein the forming the metal hard mask is performed at least in part with an atomic layer deposition.

20. The method of claim 9, wherein the forming the metal hard mask is performed such that a total thickness of the metal hard mask is between about 100 Å and about 400 Å.

* * * * *